(12) United States Patent
Kim et al.

(10) Patent No.: US 9,923,018 B2
(45) Date of Patent: Mar. 20, 2018

(54) IMAGE SENSOR (71) Applicants: Rayence Co., Ltd., Gyeonggi-do (KR); VATECH EWOO Holdings Co., Ltd., Gyeonggi-do (KR)

(72) Inventors: Tae Woo Kim, Gyeonggi-do (KR); Dong Jin Lee, Gyeonggi-do (KR)

(73) Assignees: Rayence Co., Ltd., Gyeonggi-do (KR); VATECH EWOO Holdings Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/302,251

(22) PCT Filed: Apr. 7, 2015

(86) PCT No.: PCT/KR2015/003447
§ 371 (c)(1),
(2) Date: Oct. 6, 2016

(87) PCT Pub. No.: WO2015/156567
PCT Pub. Date: Oct. 15, 2015

(65) Prior Publication Data
US 2017/0033149 A1 Feb. 2, 2017

(30) Foreign Application Priority Data

Apr. 7, 2014 (KR) ........................ 10-2014-0041196

(51) Int. Cl.
*H01L 27/146* (2006.01)

(52) U.S. Cl.
CPC .... *H01L 27/14676* (2013.01); *H01L 27/1462* (2013.01); *H01L 27/1463* (2013.01); *H01L 27/14609* (2013.01)

(58) Field of Classification Search
CPC ......... H01L 27/14676; H01L 27/14609; H01L 27/1462; H01L 27/1463; H01L 27/14689
See application file for complete search history.

(56) References Cited

U.S. PATENT DOCUMENTS

| 4,621,275 | A | | 11/1986 | Ueno et al. | |
|---|---|---|---|---|---|
| 6,025,599 | A | * | 2/2000 | Lee | H01L 27/14676 250/370.09 |
| 7,671,385 | B2 | * | 3/2010 | Wang | H01L 27/1463 257/233 |

(Continued)

FOREIGN PATENT DOCUMENTS

| JP | 06-260625 A | 9/1994 |
|---|---|---|
| JP | 2000-031447 A | 1/2000 |

(Continued)

OTHER PUBLICATIONS

European Patent Office, European Search Report of EP Application No. 15 776 781.5, Oct. 19, 2017.

*Primary Examiner* — Alonzo Chambliss
(74) *Attorney, Agent, or Firm* — IP Legal Services, LLC (57) ABSTRACT

Disclosed is an improvement of strength of adhesion between a photoconductive layer and a substrate. The image sensor includes a first electrode and a protruding pattern formed around the first electrode on the substrate, a protective film having an protruded surface formed on the protruding pattern, the photoconductive layer formed on the protective film, and a second electrode formed on the photoconductive layer.

13 Claims, 6 Drawing Sheets

(56) References Cited

U.S. PATENT DOCUMENTS

| | | |
|---|---|---|
| 2002/0131011 A1 | 9/2002 | Izumi |
| 2005/0012102 A1 | 1/2005 | Izumi |
| 2006/0177958 A1 | 8/2006 | Mongellaz et al. |
| 2008/0210946 A1* | 9/2008 | Okada ............... H01L 27/14603 257/71 |
| 2008/0290440 A1 | 11/2008 | Lee |
| 2010/0193848 A1* | 8/2010 | Lee ................... H01L 27/14667 257/294 |

FOREIGN PATENT DOCUMENTS

| | | |
|---|---|---|
| JP | 2010-206128 A | 9/2010 |
| KR | 10-2003-0089674 A | 11/2003 |
| KR | 10-0718881 B1 | 5/2007 |

* cited by examiner

IMAGE SENSOR

CROSS REFERENCE TO RELATED APPLICATIONS

This application is a National Stage Patent Application of PCT International Patent Application No. PCT/KR2015/003447 (filed on Apr. 7, 2015) under 35 U.S.C. §371, which claims priority to Korean Patent Application No. 10-2014-0041196 (filed on Apr. 7, 2014), the teachings of which are incorporated herein in their entireties by reference.

TECHNICAL FIELD

The present invention relates, in general, to an image sensor and, more particularly, to an image sensor having improved strength of adhesion between a photoconductive layer and a substrate, and a method of manufacturing the same.

BACKGROUND ART

Conventionally, films and screens are used in radiography in medicine and industry. However, developing and storing the film used in radiography is inefficient in terms of costs and time.

In order to overcome this problem, a digital image sensor is currently widely used. Such an image sensor may be classified into an indirect conversion type and a direct conversion type.

In the indirect conversion type, X-rays are converted into visible rays using a scintillator, and the visible rays are then converted into electrical signals. On the other hand, in the direct conversion type, the X-rays are directly converted into electrical signals using a photoconductive layer. Since a separate scintillator is not required and light does not spread in the direct conversion type, the direct conversion type is suitable for high-resolution systems.

The photoconductive layer used in the direct conversion type is formed on the surface of a CMOS substrate by deposition. However, the photoconductive layer adheres poorly to the protective film of the surface of the CMOS substrate. Therefore, the photoconductive layer may be peeled from the surface of the substrate.

DISCLOSURE

Technical Problem

Accordingly, the present invention has been made keeping in mind the above problems occurring in the related art, and an object of the present invention is to provide a method of improving the strength of adhesion between a photoconductive layer and a substrate.

Technical Solution

In order to accomplish the above object, the present invention provides an image sensor including a first electrode and a protruding pattern formed around the first electrode on a substrate, a protective film having an protruded surface formed on the protruding pattern, a photoconductive layer formed on the protective film, and a second electrode formed on the photoconductive layer.

The protruding pattern and the first electrode are formed by a same material and on a same layer. The thickness of the pattern may be same or greater than the thickness of the first electrode. The surface area of a protruded protective film may be same or more than twice of a flat surface area of the protective film. The protruding pattern may receive a voltage or may be in a floating state. The image sensor may further include a metal pattern formed between the protective film and the photoconductive layer, having a monolayer or multilayer structure, and receiving a voltage or is in a floating state. The metal pattern may include at least one material of Au, Pt, Pd, Cr, Cu, Ti, and Ni. The protective film may include a first protective layer including silicon oxide and a second protective layer including silicon nitride on the first protective layer. The first electrode and the protruding pattern may have a multilayer structure. The photoconductive layer may include at least one material of CdTe, CdZnTe, PbO, $PbI_2$, $HgI_2$, GaAs, Se, TlBr, $BiI_3$, CdMnTe, CdMg, Te, and InI.

The present invention also provides a method of manufacturing an image sensor, the method including forming a first electrode and a protruding pattern around the first electrode on a substrate, forming a protective film having an protruded surface on the protruding pattern, forming a photoconductive layer on the protective film, and forming a second electrode on the photoconductive layer.

The method may include forming a metal pattern that is positioned between the protective film and the photoconductive layer, has a monolayer or multilayer structure, and receives a voltage or is in a floating state. The forming the first electrode and the protruding pattern may include forming a metal material layer on the substrate, forming a first photoresist pattern and a second photoresist pattern thinner than the first photoresist pattern on the metal material layer, etching the metal material layer using the first and second photoresist patterns to form the protruding pattern beneath the first photoresist pattern and to form the metal pattern beneath the second photoresist pattern, performing an ashing process to remove the second photoresist pattern, and partially removing a metal pattern by etching using the first photoresist pattern subjected to the ashing process, thus forming the first electrode.

Advantageous Effects

According to the present invention, a protruding pattern may be formed on a substrate so that a protective film on the pattern is also formed so as to be protruded. Therefore, the contact area between a photoconductive layer, which is formed on the protective film, and the substrate, on which the protective film is formed, may be increased to thus improve the strength of adhesion of the photoconductive layer.

Particularly, the protruding pattern may be formed while the pixel electrode is formed. Accordingly, there is a merit in that process efficiency is improved compared to the case where a separate process such as surface treatment is required to make the protective film protruded.

BEST MODE

Hereinafter, a detailed description will be given of embodiments of the present invention with reference to the drawings.

Figure 1:
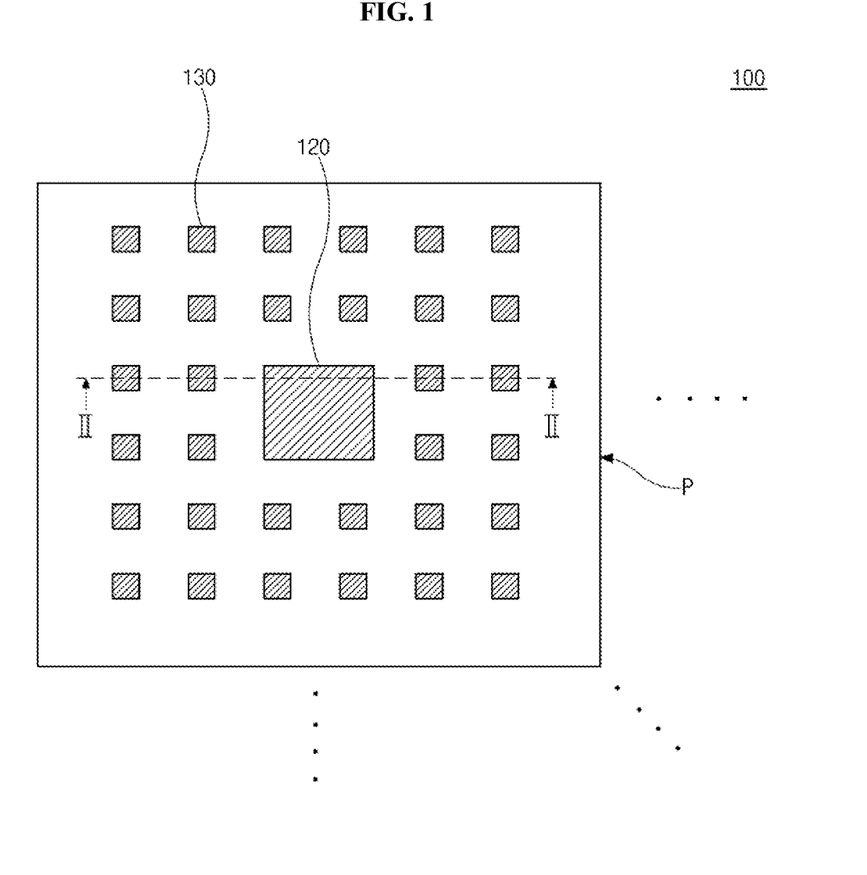
FIGS. 1 and 2 are a plan view and a sectional view schematically showing a pixel portion of an image sensor according to a first embodiment of the present invention.
Figure 2:
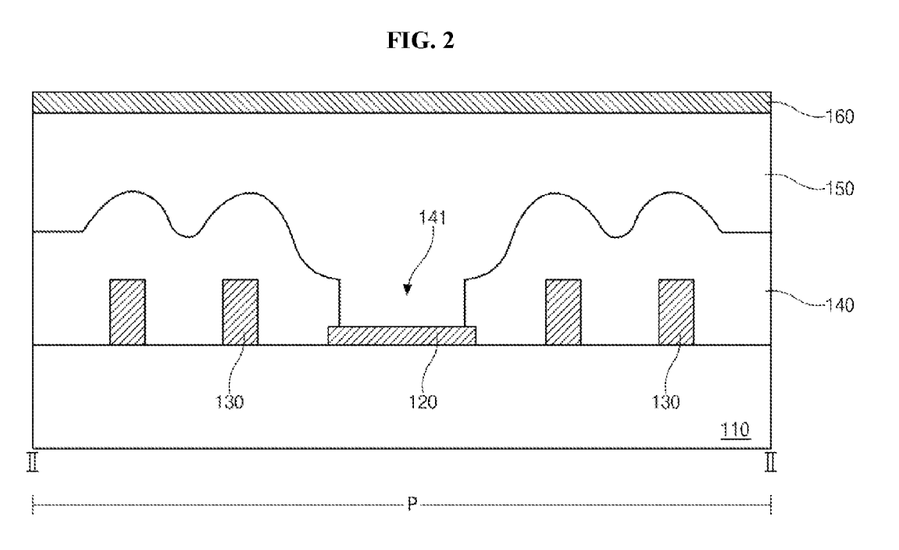

FIGS. 1 and 2 are a plan view and a sectional view schematically showing a pixel portion of an image sensor according to a first embodiment of the present invention.

X-ray image devices having various shapes for various purposes may be used as the X-ray image device including the image sensor 100 according to the first embodiment of the present invention. For example, various X-ray image devices such as a mammography device or a CT device may be used.

The image sensor 100 detects an X-ray passing through a subject substance and converts the X-ray into an electrical signal. The image sensor 100 is quadrangular in a plan view, without being limited thereto.

Particularly, the image sensor 100 according to the embodiment of the present invention is a direct-conversion type X-ray detection device, which directly converts the incident X-ray into an electrical signal.

Referring to FIGS. 1 and 2, a plurality of pixel areas P may be disposed along row and column lines in a matrix arrangement in the image sensor 100.

Each pixel area P may include a photoelectric conversion device that converts the X-ray into the electrical signal.

Examples of a substrate 110 used in the image sensor 100 may include a semiconductor, for example, a silicon substrate, a glass substrate, a graphite substrate, and a substrate including an aluminum oxide ($Al_2O_3$) base and ITO layered on the base, but are not limited thereto. For the convenience of description, in the embodiment of the present invention, a CMOS substrate including at least one insulating layer, a signal wire, and an electrode on a semiconductor substrate is described by way of example.

A pixel electrode 120 and a protruding pattern 130 may be formed in the pixel area P on the substrate 110.

The pixel electrode 120 is an electrode constituting the photoelectric conversion device and corresponds to, for example, a first electrode 120.

The protruding pattern 130 includes the same material as the pixel electrode 120. The pattern is preferably formed while the pixel electrode 120 is formed, without being limited thereto. The pixel electrode 120 and the protruding pattern 130 may have a multilayer structure including aluminum (Al), aluminum (Al) alloy, and aluminum (Al) layers, without being limited thereto.

A plurality of protruding patterns 130 are spaced apart from each other around the portion of the pixel area P that includes the pixel electrode 120. The patterns are spaced apart from the pixel electrode 120, thus being electrically insulated from the pixel electrode. Meanwhile, the protruding pattern 130 may have various shapes in a plan view, for example, a dot or line shape.

The protruding pattern 130 causes a protective film 140 formed thereon to be protruded.

It is preferable for the protruding pattern 130 to have a predetermined thickness so as to form the protruding protective film 140.

It is particularly preferable for the thickness of the protruding pattern 130 to be the same as or larger than that of the pixel electrode 120. For example, the pixel electrode 120 may have a thickness of about 0.1 µm, and the protruding pattern 130 may have a thickness that is 1.0 to 10 µm larger than that of the pixel electrode 120. When the thickness of the protruding pattern 130 is lower than 1.0 µm, it is difficult to improve the strength of adhesion to the desired level, and when the thickness is larger than 10 µm, step coverage becomes poor due to steps.

The method of forming the pixel electrode 120 and the protruding pattern 130, which is thicker than the pixel electrode, is shown in FIGS. 3 to 6.

Figure 3:
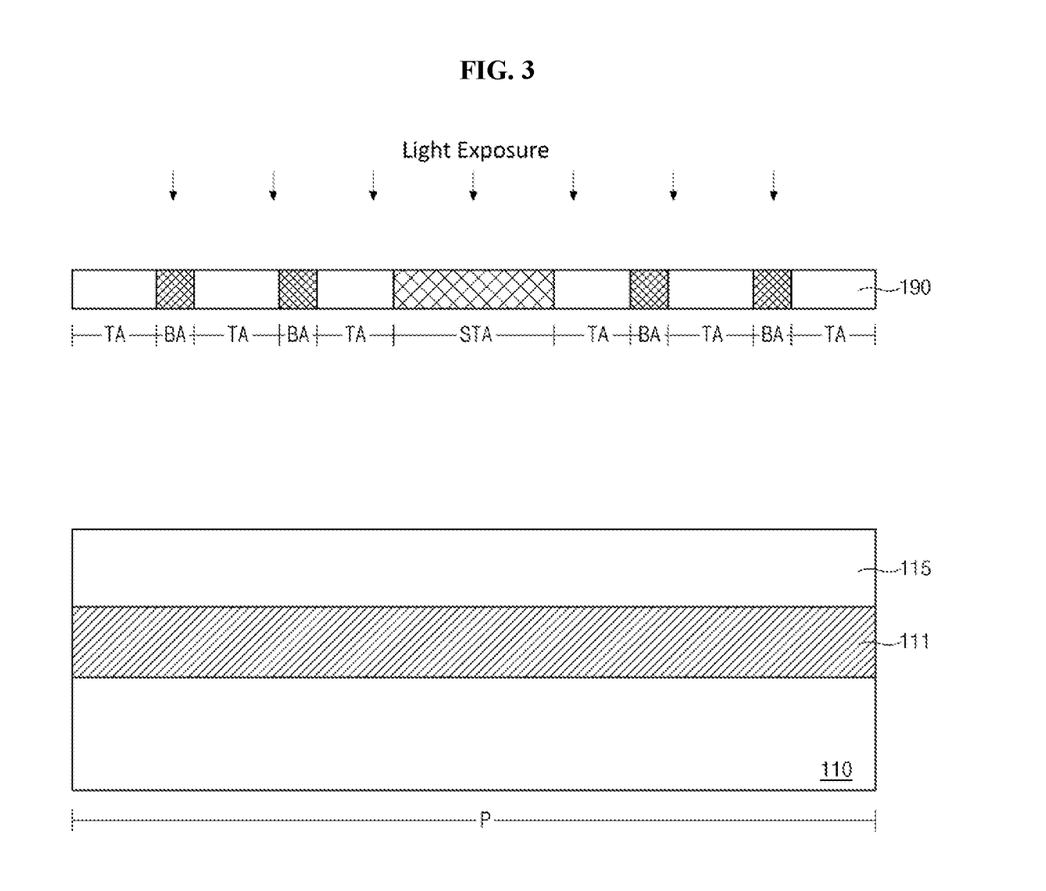
FIGS. 3 to 6 are sectional views schematically showing an exemplified method of forming a pixel electrode and a protruding pattern according to the first embodiment of the present invention.

As shown in FIG. 3, a metal material layer 111 is formed on the substrate 110, and a photoresist layer 115 is formed thereon. Subsequently, a photomask 190 having a semi-transmissive area (STA), such as a halftone mask or a diffraction exposing mask, is positioned on the substrate 110 to perform an exposure process. Meanwhile, for the convenience of description, a positive-type photoresist layer, from which a portion receiving light is removed, is used as the photoresist layer 115.

The photomask 190 may include the semi-transmissive area (STA), a blocking area (BA), and a transmissive area (TA), and may be disposed so that the semi-transmissive area (STA) corresponds to a portion in which the pixel electrode 120 is to be formed, the blocking area (BA) corresponds to a portion in which the protruding pattern 130 is to be formed, and the transmissive area (TA) corresponds to the remaining portion.

Figure 4:
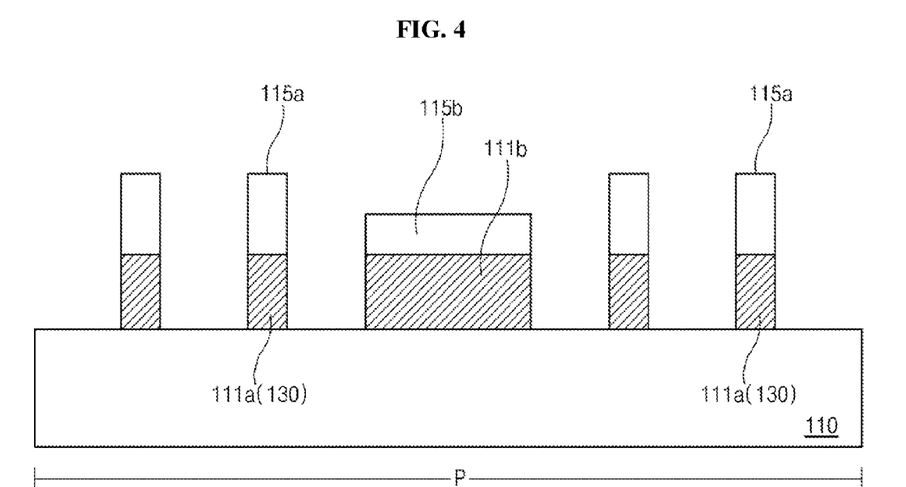

The exposure process is performed and the photoresist layer 115 is developed, depending on the disposal, thus forming first and second photoresist patterns 115a and 115b having different thicknesses, as in FIG. 4. The first photoresist pattern 115a is thicker than the second photoresist pattern 115b.

Next, the metal material layer 111 is subjected to a first etching process using the first and second photoresist patterns 115a and 115b as etching masks, thus forming first and second metal patterns 111a and 111b beneath the first and second photoresist patterns 115a and 115b, respectively. The first metal pattern 111a corresponds to the protruding pattern 130.

Figure 5:
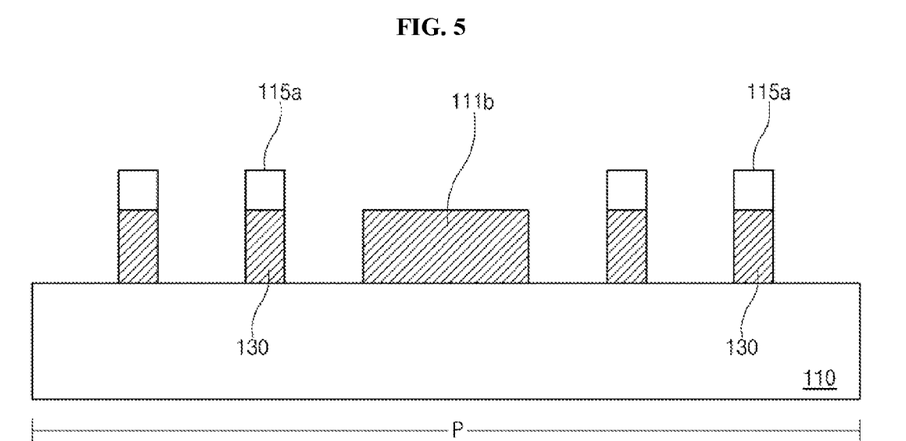

Next, as shown in FIG. 5, an ashing process is performed over the first and second photoresist patterns 115a and 115b to remove the second photoresist pattern 115b, thereby exposing the second metal pattern 111b. The first photoresist pattern 115a is partially removed to a predetermined thickness and a portion thereof remains on the first metal pattern 111a, that is, the protruding pattern 130.

Figure 6:
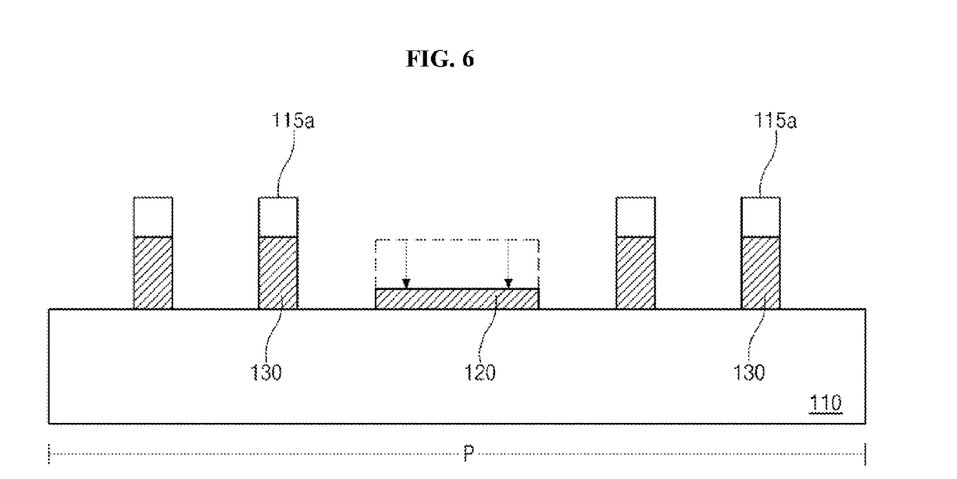

Next, as shown in FIG. 6, a second etching process is performed to partially etch the second metal pattern 111b to a predetermined thickness, thereby forming the pixel electrode 120.

The pixel electrode 120 and the protruding pattern 130 which is thicker than the pixel electrode may be formed through one photomask process according to the aforementioned procedure.

A protective film 140 is formed on the protruding pattern 130 and the pixel electrode 120. A pad hole 141 is formed in the protective film 140 to expose the pixel electrode 120 therethrough. The protective film 140 may be formed using an inorganic insulating material or an organic insulating material.

Particularly, the protective film 140 according to the embodiment of the present invention has a surface that is protruded due to the protruding pattern 130 formed thereunder.

That is, a convex portion that protrudes upwards is formed in the area including the protruding pattern 130. A concave portion that is indented downwards is formed in the area in which the protruding pattern 130 is not formed, that is, the area between the protruding patterns 130. Thereby, the surface of the protective film 140 is made protruded.

Therefore, the surface of the protective film 140 is protruded to thus increase the surface area thereof. The surface area of the protective film 140 may be increased to thus increase the contact area with a photoconductive layer 150 formed on the protective film 140 so that the strength of adhesion of the photoconductive layer 150 to the substrate can be improved.

The protective film 140 having the protruded surface preferably has a surface area that is at least two times that of the protective film having the flat surface, without being limited thereto.

Meanwhile, as shown in FIG. 2, the protective film 140 may have a monolayer structure, without being limited thereto. For example, the protective film 140 may have a multilayer structure. With respect thereto, a protective film 140 having a double-layer structure is shown in FIG. 7.

Figure 7:
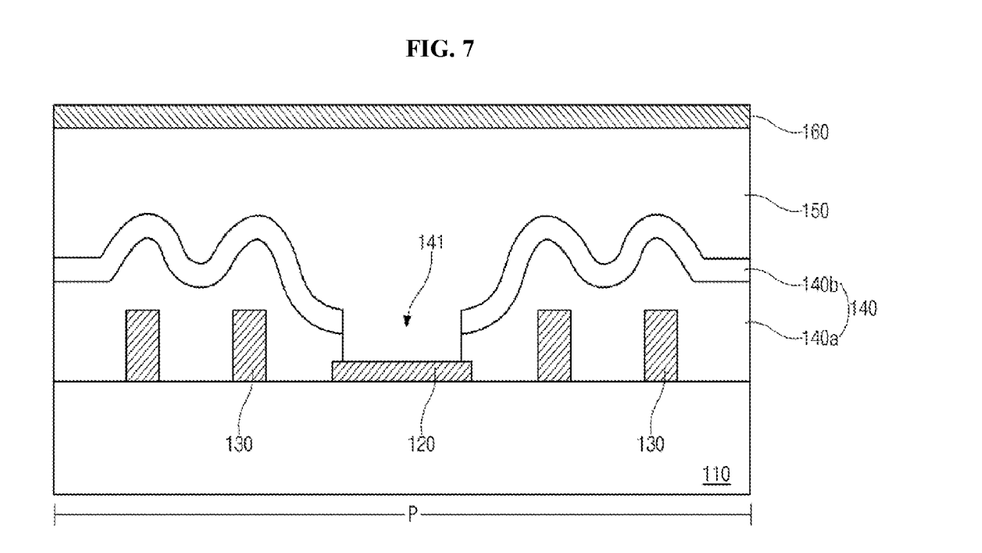
FIG. 7 is a sectional view schematically showing the image sensor having the double-layered protective film according to the first embodiment of the present invention.

Referring to FIG. 7, the protective film 140 may include a first protective layer 140a at a lower part and a second protective layer 140b at an upper part. Preferably, the first protective layer 140a includes a soft material, for example, silicon oxide ($SiO_2$), and the second protective layer 140b includes a hard material, for example, silicon nitride ($Si_3N_4$), without being limited thereto.

In the aforementioned layering structure, when only silicon nitride is used, the concave and convex portions are not gently formed due to the hard material, and accordingly, defects such as cracks or pinholes may be formed, resulting in current leakage.

In order to prevent this, the first protective layer 140a includes a lower part that may be a silicon oxide layer which is rather soft. Therefore, the first protective layer 140a may be protruded, and the second protective layer 140b, which includes silicon nitride and which is formed on the first protective layer, may be influenced by the protruded form of the first protective layer 140a. Thereby, the occurrence of defects in the second protective layer 140b may be minimized. Even though the defects are occurred in the second protective layer 140b, problems like current leakage caused by the defects may be prevented by the first protective layer 140a which is formed under the second protective layer 140b.

The photoconductive layer 150 is formed on the protective film 140. The photoconductive layer 150 generates an electron-hole pair when an X-ray is incident thereon. A material having an excellent charge-moving ability, a high absorption coefficient, low dark current, and low electron-hole pair generation energy may be used in the photoconductive layer 150. For example, at least one of the photoconductive material groups, such as CdTe, CdZnTe, PbO, $PbI_2$, $HgI_2$, GaAs, Se, TlBr, $BiI_3$, CdMnTe, CdMg, Te, and InI, may be used. The photoconductive layer 150 may have a thickness of 200 to 500 μm.

An upper electrode 160 may be formed on the substantially entire surface of the substrate 110 on which the photoconductive layer 150 is formed. A bias voltage may be applied to the upper electrode 160. The upper electrode 160 is another electrode constituting the photoelectric conversion device, for example, a second electrode 160. The second electrode 160 may include, for example, Au, without being limited thereto.

Meanwhile, in the image sensor 100 having the aforementioned constitution, the protruding pattern 130 may cause the protective film 140 to be protruded, and may concentrate an electric field between the first and second electrodes 120 and 160 to thus reduce a leakage current.

With respect thereto, the protruding pattern 130 may be formed around the first electrode 120, thus inwardly diverting the electric field generated between the second electrode 160 and the first electrode 120. In other words, the protruding pattern 130 may serve as a guard ring with respect to the generation of the electric field.

To attain this end, the protruding pattern 130 may receive a voltage having a polarity opposite to that of the pixel electrode 120, or may be in a floating state.

Figure 8:
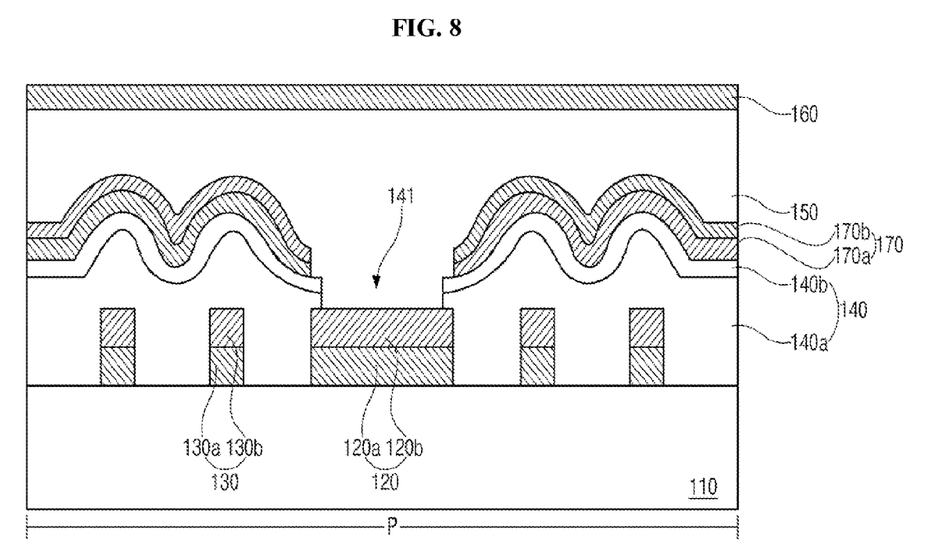
FIG. 8 is a sectional view schematically showing a pixel portion of an image sensor according to a second embodiment of the present invention.

FIG. 8 is a sectional view schematically showing a pixel portion of an image sensor according to a second embodiment of the present invention. For the convenience of description, parts that are the same as or similar to those of the first embodiment may be omitted.

Referring to FIG. 8, an image sensor 100 according to the second embodiment of the present invention may include a pixel electrode 120 formed on a substrate 110 and a protruding pattern 130 formed around the pixel electrode 120, a protective film 140 formed on them, a metal pattern 170 formed on the protective film 140, a photoconductive layer 150 formed on the metal pattern 170 to come into contact with the pixel electrode 120, and an upper electrode 160 formed on the photoconductive layer 150.

The pixel electrode 120 and the protruding pattern 130 may be formed using the same process as the first embodiment, and may have a multilayer structure. For the convenience of description, the pixel electrode 120 and the protruding pattern 130 are exemplified as having a double-layer structure.

In the case of the double-layer structure, first layers 120a and 130a, which are lower layers of the pixel electrode 120 and the protruding pattern 130, may include aluminum (Al), and second layers 120b and 130b, which are upper layers, may include titanium (Ti), without being limited thereto.

When the protruding pattern 130 has a multilayer structure, the pattern may have a predetermined thickness, which is required in order to form the protruded pattern due to the multilayer structure.

With regard to this, the pixel electrode 120 and the protruding pattern 130 may be the same thickness. In the case where the thicknesses are the same, a photomask may not be imparted with a semi-transmissive area during an exposure process.

Needless to say, if necessary, the pixel electrode 120 may be partially etched using the photomask having the semi-transmissive area, as in the first embodiment, so that the pixel electrode 120 is thinner than the protruding pattern 130. For example, the second layer 120b, which is the upper layer, may be removed so that the pixel electrode 120 has a monolayer structure.

The protective film 140 may have a monolayer or multi-layer structure. In the present embodiment, the protective film 140 has a double-layer structure. The protective film 140 may be slightly protruded, and may have improved reliability due to the double-layer structure thereof, as in the first embodiment.

Meanwhile, the metal pattern 170 may be formed on the protective film 140. The metal pattern 170 is made protruded due to the protective film 140 positioned thereunder.

The metal pattern 170 may include a metal material having conductivity, and particularly at least one material of gold (Au), silver (Ag), platinum (Pt), palladium (Pd), chromium (Cr), copper (Cu), titanium (Ti), and nickel (Ni).

Moreover, the metal pattern 170 may have a monolayer or multilayer structure. In the present embodiment, the metal pattern 170 has a double-layer structure. In the case of a double-layer structure, a first metal layer 170a, which is a lower layer, and a second metal layer 170b, which is an upper layer, may include two materials selected from among the aforementioned materials.

The material constituting the metal pattern 170 has excellent strength of adhesion to the protective film 140. Therefore, the metal pattern 170 may be provided between the protective film 140 and the photoconductive layer 150 formed during a subsequent process, thereby improving the strength of adhesion of the photoconductive layer 150 to the substrate 110.

Particularly, the photoconductive layer 150 has poor strength of adhesion to the protective layer 140b including silicon nitride, but the metal pattern 170 may serve to effectively improve the strength of adhesion.

It is preferable for the metal pattern 170 to be spaced apart from the pixel electrode 120 so as to be electrically disconnected from the pixel electrode. That is, the metal pattern 170 may be formed in at least a portion of the surrounding area of the pixel electrode 120 in a plan view. The metal pattern 170 may have an area of about 10 to 90% of the total area of the pixel area P.

The photoconductive layer 150 may be formed on the metal pattern 170 having the aforementioned constitution, thereby improving the strength of adhesion of the photoconductive layer 150. For reference, the area of the metal pattern 170 in the pixel area P may be in inverse proportion to the area of the pixel electrode 120.

Meanwhile, the metal pattern 170 may concentrate an electric field, like the protruding pattern of the first embodiment, thereby reducing leakage current.

That is, the metal pattern 170 may be formed around the pixel electrode 120, thus inwardly diverting the electric field generated between the upper electrode 160 and the pixel electrode 120. In other words, the metal pattern 170 may serve as a guard ring with respect to the generation of the electric field.

To attain this end, the metal pattern 170 may receive a voltage having a polarity opposite to that of the pixel electrode 120, or may be in a floating state.

Needless to say, in the second embodiment, the protruding pattern 130 may serve as the guard ring, and both the metal pattern 170 and the protruding pattern 130 may serve as the guard ring.

INDUSTRIAL APPLICABILITY

As described above, according to the embodiments of the present invention, a protruding pattern may be formed on a substrate so that a protective film on the pattern is also formed so as to be protruded. Therefore, the contact area between a photoconductive layer, which is formed on the protective film, and the substrate, on which the protective film is formed, may be increased, thus improving the strength of adhesion of the photoconductive layer.

Particularly, the protruding pattern may be formed while the pixel electrode is formed. Accordingly, there is a merit in that process efficiency is improved compared to the case where a separate process such as surface treatment is required to make the protective film protruded.

The invention claimed is:

1. An image sensor comprising:
a first electrode formed on a substrate;
a protruding pattern formed around the first electrode on the substrate;
a protective film formed on the protruding pattern to have a protruded surface caused by the protruding pattern and to have a pad hole exposing the first electrode;
a photoconductive layer formed on the protective film and contacted to the first electrode through the pad hole; and
a second electrode formed on the photoconductive layer, wherein the protruding pattern and the first electrode are formed by a same material and on a same layer.

2. The image sensor of claim 1, wherein a thickness of the protruding pattern is same or greater than a thickness of the first electrode.

3. The image sensor of claim 1, wherein the protruded surface of the protective film has an area twice wider than a protective film formed to have a flat surface.

4. The image sensor of claim 1, wherein the protruding pattern receives a voltage or is in a floating state.

5. The image sensor of claim 1, wherein the first electrode and the protruding pattern have a multilayer structure.

6. The image sensor of claim 1, wherein the photoconductive layer includes at least one material of CdTe, CdZnTe, PbO, PbI2, HgI2, GaAs, Se, TlBr, BiI3, CdMnTe, CdMg, Te, and InI.

7. The image sensor of claim 1, wherein the protruding pattern concentrates an electric field between the first electrode and the second electrode.

8. The image sensor of claim 1, wherein the protruding pattern includes a guard ring for the electric field.

9. The image sensor of claim 1, wherein a thickness of the protruding pattern is 1.0 µm~10.0 µm.

10. The image sensor of claim 1, wherein the protective film includes at least two layers having different hardness.

11. An image sensor comprising:
a first electrode formed on a substrate;
a protruding pattern formed around the first electrode on the substrate;
a protective film formed on the protruding pattern to have a protruded surface caused by the protruding pattern and to have a pad hole exposing the first electrode;
a photoconductive layer formed on the protective film and contacted to the first electrode through the pad hole;
a second electrode formed on the photoconductive layer; and
a metal pattern formed between the protective film and the photoconductive layer, having a monolayer or multilayer structure, and receiving a voltage or is in a floating state.

12. The image sensor of claim 11, wherein the metal pattern includes at least one material of Au, Pt, Pd, Cr, Cu, Ti, and Ni.

13. An image sensor comprising:
a first electrode formed on a substrate;
a protruding pattern formed around the first electrode on the substrate;
a protective film formed on the protruding pattern to have a protruded surface caused by the protruding pattern and to have a pad hole exposing the first electrode;
a photoconductive layer formed on the protective film and contacted to the first electrode through the pad hole; and
a second electrode formed on the photoconductive layer, wherein the protective film includes a first protective layer including silicon oxide and a second protective layer including silicon nitride on the first protective layer.

* * * * *